US011820058B2

(12) United States Patent
He et al.

(10) Patent No.: US 11,820,058 B2
(45) Date of Patent: Nov. 21, 2023

(54) INJECTION MOULD AND INJECTION MOULDING METHOD

(71) Applicant: CHANGXIN MEMORY TECHNOLOGIES, INC., Hefei (CN)

(72) Inventors: Jun He, Hefei (CN); Jie Liu, Hefei (CN); Changhao Quan, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 183 days.

(21) Appl. No.: 17/373,930

(22) Filed: Jul. 13, 2021

(65) Prior Publication Data
US 2021/0339443 A1 Nov. 4, 2021

Related U.S. Application Data

(63) Continuation of application No. PCT/CN2021/075942, filed on Feb. 8, 2021.

(30) Foreign Application Priority Data

Feb. 19, 2020 (CN) .......................... 202010102763.2

(51) Int. Cl.
*B29C 45/26* (2006.01)
*B29C 45/14* (2006.01)
(Continued)

(52) U.S. Cl.
CPC .... *B29C 45/2602* (2013.01); *B29C 45/14344* (2013.01); *B29C 45/72* (2013.01); *B29L 2031/34* (2013.01)

(58) Field of Classification Search
None
See application file for complete search history.

(56) References Cited

U.S. PATENT DOCUMENTS 5,866,442 A   2/1999  Brand
5,923,959 A * 7/1999  Mess ................. B29C 45/14655
                                                              438/126
(Continued)

FOREIGN PATENT DOCUMENTS

CN       1698197 A    11/2005
CN     101058709 A    10/2007
(Continued)

OTHER PUBLICATIONS

Supplementary European Search Report in the European application No. 21757866.5, dated May 17, 2022, 11 pgs.
(Continued)

*Primary Examiner* — Alison L Hindenlang
*Assistant Examiner* — Olukorede Esan
(74) *Attorney, Agent, or Firm* — COOPER LEGAL GROUP, LLC

(57) ABSTRACT

An injection mould and an injection moulding method are provided. The injection mould includes a base plate used to place a packaged chip to be injection moulded including a substrate and at least one of the chips fixed on the front substrate by a flip chip process. The substrate has a gas hole. Two or more gas ducts that extend in at least two intersected directions and connect with one another are formed in the base plate. Two ends of each one of gas ducts are open, and at least one of the gas ducts is buried into the base plate. Each one of gas ducts is provided with a gas outlet. When the packaged chip is placed on the base plate, the gas outlet connects with the gas hole of the substrate.

13 Claims, 15 Drawing Sheets

(51) Int. Cl.
  *B29C 45/72*  (2006.01)
  *B29L 31/34*  (2006.01)

(56) References Cited

U.S. PATENT DOCUMENTS

| | | |
|---|---|---|
| 6,007,317 A | 12/1999 | Mess |
| 6,124,643 A | 9/2000 | Brand |
| 6,164,946 A | 12/2000 | Mess |
| 6,179,598 B1 | 1/2001 | Brand |
| 6,232,145 B1 | 5/2001 | Brand |
| 6,325,606 B1 | 12/2001 | Brand |
| 6,335,221 B1 | 1/2002 | Mess |
| 6,383,846 B1 | 5/2002 | Shen |
| 6,443,720 B1 | 9/2002 | Brand |
| 6,455,349 B2 | 9/2002 | Brand |
| 6,685,454 B2 | 2/2004 | Brand |
| 6,706,555 B2 | 3/2004 | Brand |
| 9,252,095 B2 | 2/2016 | Kim |
| 2001/0018261 A1 | 8/2001 | Brand |
| 2002/0031566 A1 | 3/2002 | Brand |
| 2002/0192320 A1 | 12/2002 | Brand |
| 2002/0192861 A1 | 12/2002 | Brand |
| 2005/0106784 A1* | 5/2005 | Xia .................. B29C 45/14065 264/272.17 |
| 2012/0139109 A1 | 6/2012 | Choi |
| 2014/0021593 A1 | 1/2014 | Jang et al. |

FOREIGN PATENT DOCUMENTS

| | | |
|---|---|---|
| CN | 101347968 A | 1/2009 |
| CN | 203254619 U | 10/2013 |
| CN | 204773390 U | 11/2015 |
| CN | 207711281 U | 8/2018 |
| CN | 207841976 U | 9/2018 |
| CN | 208020631 U | 10/2018 |
| CN | 108773021 A | 11/2018 |
| CN | 109262992 A | 1/2019 |
| JP | 2001267345 A | 9/2001 |
| JP | 4319759 B2 | 8/2009 |
| JP | 2009229995 A | 10/2009 |
| JP | 2012161952 A | 8/2012 |
| TW | 584922 B | 4/2004 |

OTHER PUBLICATIONS

First Office Action of the Chinese application No. 202010102763.2, dated Mar. 3, 2022, 19 pgs.
Second Office Action of the Chinese application No. 202010102763.2, dated Aug. 3, 2022, 21 pgs.
Written Opinion of the International Search Authority in the international application No. PCT/CN2021/075942, dated May 11, 2021, 7 pgs.
International Search Report in the international application No. PCT/CN2021/075942, dated May 11, 2021, 2 pgs.

* cited by examiner

INJECTION MOULD AND INJECTION MOULDING METHOD

CROSS-REFERENCE TO RELATED APPLICATION

The present application is a U.S. continuation application of International Application No. PCT/CN2021/075942, filed on Feb. 8, 2021, which claims priority to Chinese Patent Application No. 202010102763.2, filed on Feb. 19, 2020. International Application No. PCT/CN2021/075942 and Chinese Patent Application No. 202010102763.2 are incorporated herein by reference in their entireties.

TECHNICAL FIELD

The disclosure relates to the field of chip package, in particular to an injection mould and an injection moulding method.

BACKGROUND

After a chip is packaged, the packaged chip needs to be wrapped through injection moulding, so as to protect the chip.

For a chip packaged by a flip chip process, the chip is connected to a circuit on a substrate by solder bumps. In a moulding process, a moulding compound is required to wrap the whole chip to fill up a gap between the chip and the substrate. Since the chip and the substrate are connected directly by the solder bumps, the gap is relatively small, and a distance between solder balls is also relatively small. As a result, air is difficult to be exhausted during filling of the moulding compound, which easily leads to an unreliable package structure.

In the related art, in order to facilitate the exhaust of gas in an injection moulding process, a gas hole is arranged in a package substrate, so that the gas is exhausted from the gas hole of the substrate with the filling of the plastic package material in the injection moulding process. However, in the injection moulding process, the substrate is contacted to a surface of a base plate of a package mould, and the gas hole is easily blocked, so that the problem that the gas cannot be exhausted still exists.

Therefore, how to avoid gas residue in a package body in the injection moulding process is a problem to be solved urgently at present.

SUMMARY

The technical problem to be solved by the disclosure is to provide an injection mould and an injection moulding method to improve the reliability of a packaged chip after injection moulding.

In order to solve the above problem, the disclosure provides an injection mould, which includes a base plate used to place a packaged chip to be moulded. The packaged chip includes a substrate and at least one of the chips fixed on a front surface of the substrate by a flip chip process, and the substrate has a gas hole penetrating through the substrate. Two or more gas ducts that extend in at least two intersected directions and connect with one another are formed in the base plate. Two ends of each one of the gas ducts are open, and at least one of the gas ducts is buried into the base plate. The gas duct is provided with a gas outlet used to connect with the gas hole of the substrate.

The disclosure further provides an injection moulding method, the method includes following acts. An injection mould and a packaged chip to be injection moulded are provided. The packaged chip includes a substrate and at least one of the chips fixed on the front surface of the substrate by a flip chip process. The substrate has a gas hole penetrating through the substrate. The packaged chip is placed on a base plate of the injection mould. The base plate is covered with a cover to form a cavity. The packaged chip is located in the cavity. The back surface of the substrate is contacted to the surface of the base plate. The gas hole of the substrate of the packaged chip connects with a gas duct of the base plate. A moulding compound in the state of liquid is injected to the cavity through an injection hole of the cover. At least part of gas in the cavity is exhausted out of the injection mould through the gas hole and the gas duct in the injection process.

DETAILED DESCRIPTION

As mentioned in the background, in the related art, a problem that gas cannot be exhausted is prone to occur during injection moulding of a packaged chip made by a flip chip process.

In order to solve the above-mentioned problem, in one specific example of the disclosure, an injection mould is provided. A base plate of the mould is provided with a groove that can connect with a gas hole of a substrate of the packaged chip, so that gas is exhausted out of the mould from the gas hole and through the groove.

Figure 1A:
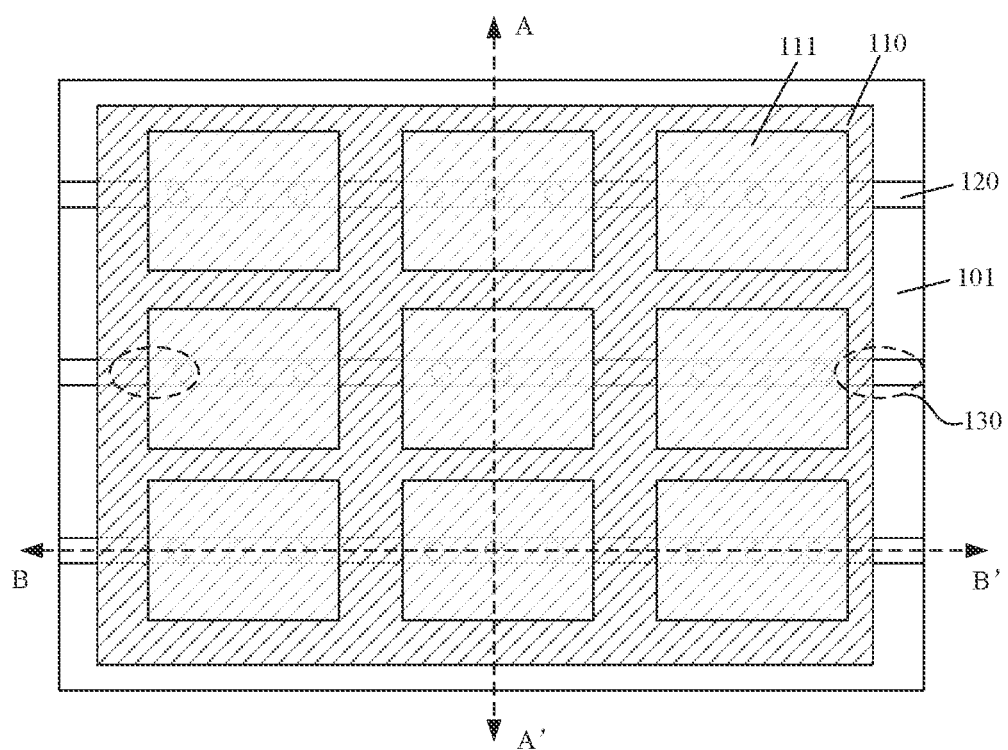
FIG. 1A to FIG. 1C are schematic structural diagrams of an injection moulding process of one specific example of the disclosure.
Figure 1B:
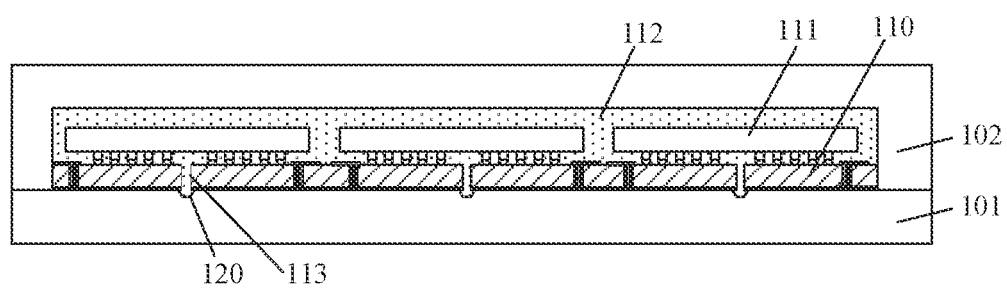
Figure 1C:
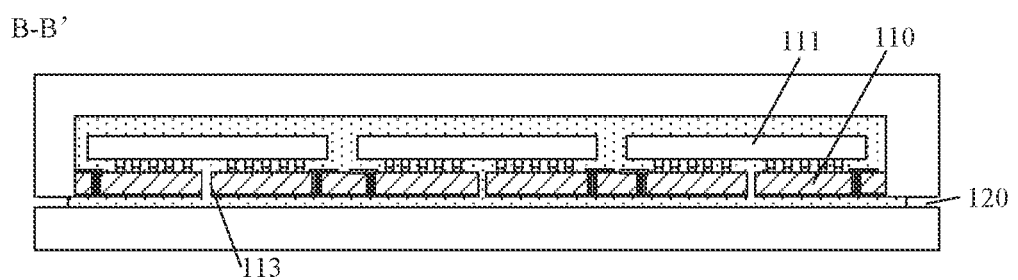

Referring to FIG. 1A to FIG. 1C, schematic structural diagrams for injection molding with an injection mold with a groove in one specific example of the disclosure are illustrated. FIG. 1A is a schematic top view; FIG. 1B is a schematic sectional view along a cut line AN in FIG. 1A; and FIG. 1C is a schematic sectional view along a cut line BB' in FIG. 1A.

The packaged chip includes a substrate 110 and a chip 111 mounted on the substrate 110 by a flip chip process. Specifically, the substrate 110 has a front surface and a back surface which are opposite, and the chip 111 is fixed on the front surface of the substrate 110. The packaged chip is placed in a cavity of the injection mould, and the substrate 110 is provided with a gas hole 113.

The injection mould includes a base plate 101 and a cover 102. The base plate 101 has a groove 120 inside. Two ends of the groove 120 are open and connect to the exterior of the injection mould. The packaged chip is placed on the base plate 101, and the gas hole 113 connects with the groove 120. During injection of a moulding compound 112, gas is exhausted out of the mould through the gas hole 113 of the substrate 110 firstly and the groove 120 of the base plate 101 secondly. As compared with a situation where only the gas hole of the substrate 110 is formed, the disclosure forms the groove 120, which connects with the gas hole 113, in the base plate 101 of the injection mould, which can further enhance the exhaust effect during injection moulding.

However, in the injection moulding process, the edge of the cavity in the mould will be usually filled with the moulding compound first; so that the chip 111 located at the edge position will be wrapped by the moulding compound first. The moulding compound overflowing from the gas hole 113 of the substrate 110 into the groove 120 may possibly block the two ends of the groove 120 at the substrate 110 (such as the position of a region 130 in FIG. 1A) when the cavity is not filled up by the moulding compound. At this time, the groove 120 will not achieve a relatively good exhaust effect, and the problem that air cannot be exhausted in the injection moulding process still exists, resulting in formation of a hole between the chip 111 and the substrate 110, affecting the reliability of the device.

The inventors further proposed a new mould to improve the above-mentioned problem.

Specific examples of a new injection mould and an injection moulding method which are provided by the disclosure are described in detail below in combination with the accompanying drawings.

In one specific implementation mould, the injection mould includes a base plate used to place a packaged chip to be injection moulded. The packaged chip includes a substrate and at least one of the chips fixed on a front surface of the substrate by a flip chip process, and the substrate has a gas hole penetrating through the substrate. Two or more gas ducts that extend in at least two intersected directions and connect with one another are formed in the base plate. Two ends of each one of the gas ducts are open, and at least one of gas ducts is buried into the base plate. The gas duct is provided with a gas outlet used to connect with the gas hole of the substrate.

Figure 2A:
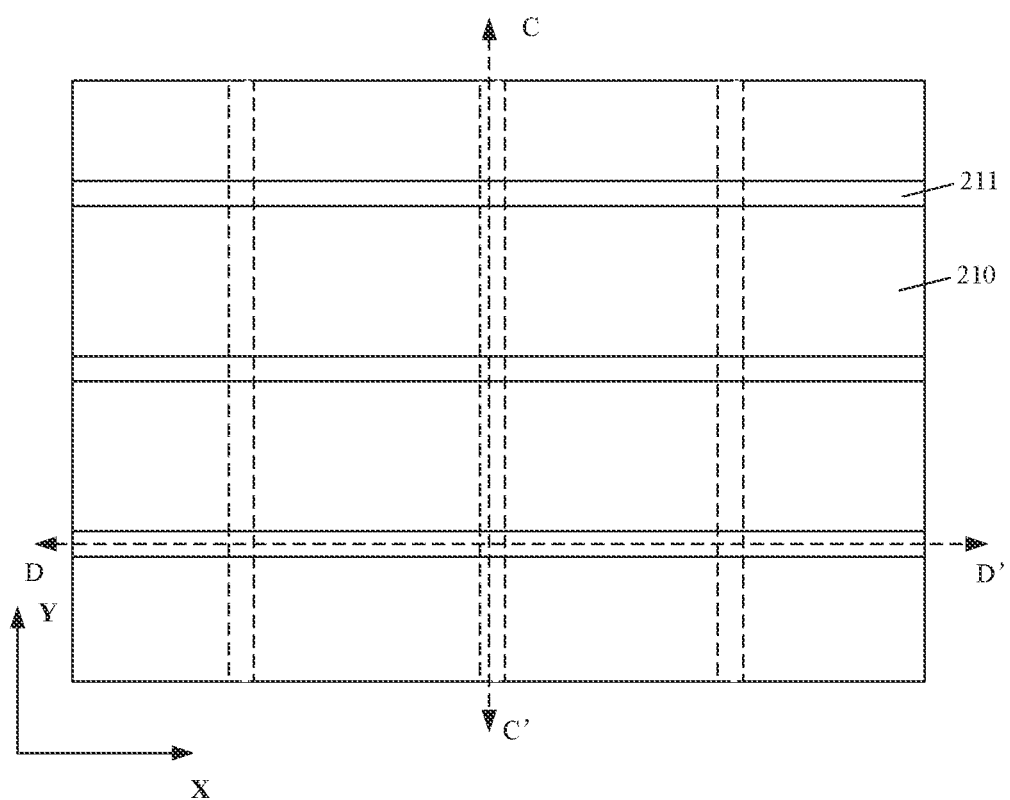
FIG. 2A to FIG. 2C are schematic structural diagrams of a base plate of an injection mould of one specific example of the disclosure.
Figure 2B:
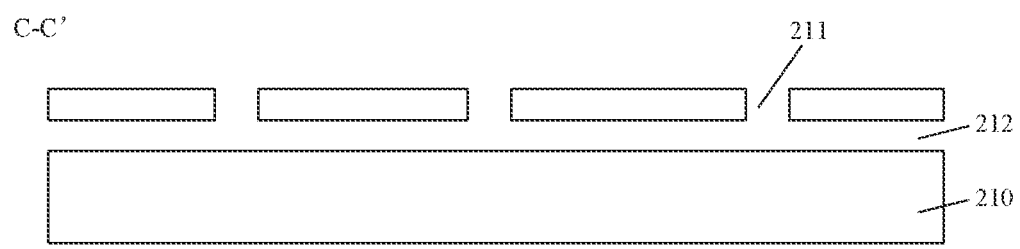
Figure 2C:
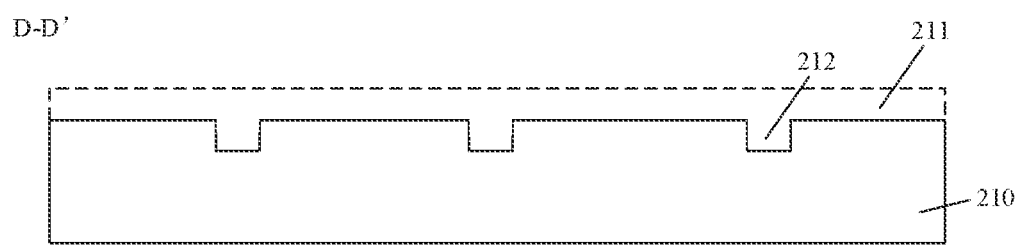

Referring to FIG. 2A to FIG. 2C, schematic structural diagrams of a base plate of an injection mould of one specific example of the disclosure are illustrated. FIG. 2A is a schematic top view of the base plate 210; FIG. 2B is a schematic sectional view along a cut line CC' in FIG. 2A; and FIG. 2C is a schematic sectional view along a cut line DD' in FIG. 2A.

The base plate 210 has a first gas duct 211 extending in a first direction and a second gas duct 212 extending in a second direction. In this specific example, the first direction is an X-axis direction, and the second direction is a Y-axis direction. The first direction is perpendicular to the second direction. In other specific examples, the first direction and the second direction can be intersected in other angles. In this specific example, forming 3 gas ducts in each of the first direction and the second direction is taken as an example. In other specific examples, the number of the gas ducts in each direction can be designed according to the structure of the packaged chip to be moulded and an actual need, and there is no limitation here.

The base plate 210 has two opposite surfaces, i.e., a front surface and a back surface. The packaged chip is applied and placed on the front surface of the base plate 210. In this specific example, the first gas duct 211 is a groove formed on the front surface of the base plate 210, and the second gas duct 212 is a tunnel buried in the base plate 210. The second gas duct 212 and the first gas duct 211 connect with each other at an intersection. The first gas duct 211 and the second gas duct 212 connect with each other at the intersection, so that the first gas duct 211 and the second gas duct 212 form a mesh-type gas duct structure. Gas can also be exhausted in other directions when any one of the intersection is blocked.

The first gas duct 211 and the second gas duct 212 are each provided with a gas outlet. An opening of one end of each gas outlet is located on the front surface of the base plate 210 and used to connect with the gas hole of the substrate of the packaged chip to be moulded. In this specific example, the first gas duct 211 is a groove. The opening of the whole groove can be used as the gas outlet of the first gas duct 211. The second gas duct 212 is buried in the base plate 210, and a gas duct region at a connection between the second gas duct 212 and the first gas duct 211 is used as the gas outlet of the second gas duct 212. In this specific example, the gas outlet of the second gas duct 212 is located at the intersection between the second gas duct 212 and the first gas duct 211.

Optionally, the gas holes of the substrate of the packaged chip to be moulded are arranged in a straight line. When the packaged chip is placed on the surface of the base plate 210, the extending direction of the first gas duct 211 is consistent with the direction in which the gas holes are arranged in the substrate, and each of the first gas ducts 211 connects to the gas holes located on the same straight line. When the packaged chip is moulded, a moulding compound enters the first gas duct from the gas hole of the substrate of the chip. Finally, after the injection moulding is completed, and the moulding compound is solidified, a moulding compound strip located on the back surface of the substrate is formed in the first gas duct to close the gas hole connecting with the first gas duct, thereby enhancing the closing effect on the gas hole of the substrate. In this specific example, the first gas duct 211 has a width range of 100 μm to 1 mm. Formation of an oversized moulding compound strip on the back surface of the substrate which occupies an excessive area of the back surface of the substrate to affect the circuit distribution on the back surface of the substrate is avoided while satisfying an exhaust requirement.

In other specific examples, gas ducts extending in three or more directions can also be formed to improve the gas exhausting efficiency. In a direction perpendicular to the surface of the base plate, the gas ducts in at least two different extending directions are respectively located at different depths of the base plate.

In one specific example, the gas ducts extending in various directions are all buried into the base plate, and the gas ducts extending in different directions are buried at different depths and perpendicularly connect with one another at an intersection. A through hole in the intersection is used as the gas outlet of the various gas ducts to connect to the gas holes of the substrate of the packaged chip to be moulded. Therefore, in this case, the number of gas outlet can be set according to the number of the gas holes of the substrate of the packaged chip to be moulded. This quantity can be equal to or greater than the quantity of the gas holes to adapt to different kinds of packaged chips. In one specific example, the gas outlet is a circular hole with a diameter ranging from 100 μm to 1 mm, preferably 200 μm, 300 μm, 400 μm, 500 μm, 600 μm, 700 μm, or 800 μm. In some specific examples, the gas outlet can also be a rectangular hole with a side ranging from 100 μm to 1 mm.

In this specific example, after the packaged chip is moulded, only a dot-like moulding compound that close the gas hole is formed on the back surface of the substrate of the packaged chip, so that the area that the moulding compound occupies on the back surface of the substrate is reduced, thereby enlarging an area of electric connection structures such as a solder pad and a solder ball formed on the back surface of the substrate.

In other specific examples, there can also be a gas duct extending in at least one direction which locates on the front surface of the base plate, and is a groove with two ends penetrating through the base plate. The gas duct extending in other directions is buried into the base plate.

In a direction perpendicular to the extending direction, the cross section of the gas duct can be circular, rectangular, semicircular, elliptical, or of other shapes.

In the specific example of the disclosure, the extending direction of the gas duct and the number of the extending directions are not limited. Those skilled in the art can design these according to actual needs.

In order to improve the gas exhausting efficiency, the gas duct can have a relatively large cross-sectional size. A maximum distance between any two points on the edge of the cross section perpendicular to a length direction of the gas duct ranges from 500 µm to 5 mm. When the cross section of the gas duct is circular, the maximum distance is the diameter of the cross section. When the cross section of the gas duct is rectangular, the maximum distance is the maximum side of the cross section.

Furthermore, different cross-sectional sizes can also be set according to the depths that the gas ducts are located in the base plate. Preferably, the cross-sectional area of the lower gas duct can be larger than the cross-sectional area of the upper gas duct. In this specific example, the first gas duct 211 is the groove located on the surface of the base plate and has a rectangular cross section with side range of 500 µm to 2 mm, preferably 800 µm to 1.7 mm. The second gas duct 212 is located below the first gas duct 211 and has a circular cross section with a diameter range of 500 µm to 5 mm, preferably 800 µm to 4 µm. The larger the cross-sectional area of the gas duct is, the higher gas exhausting efficiency results.

Figure 3:
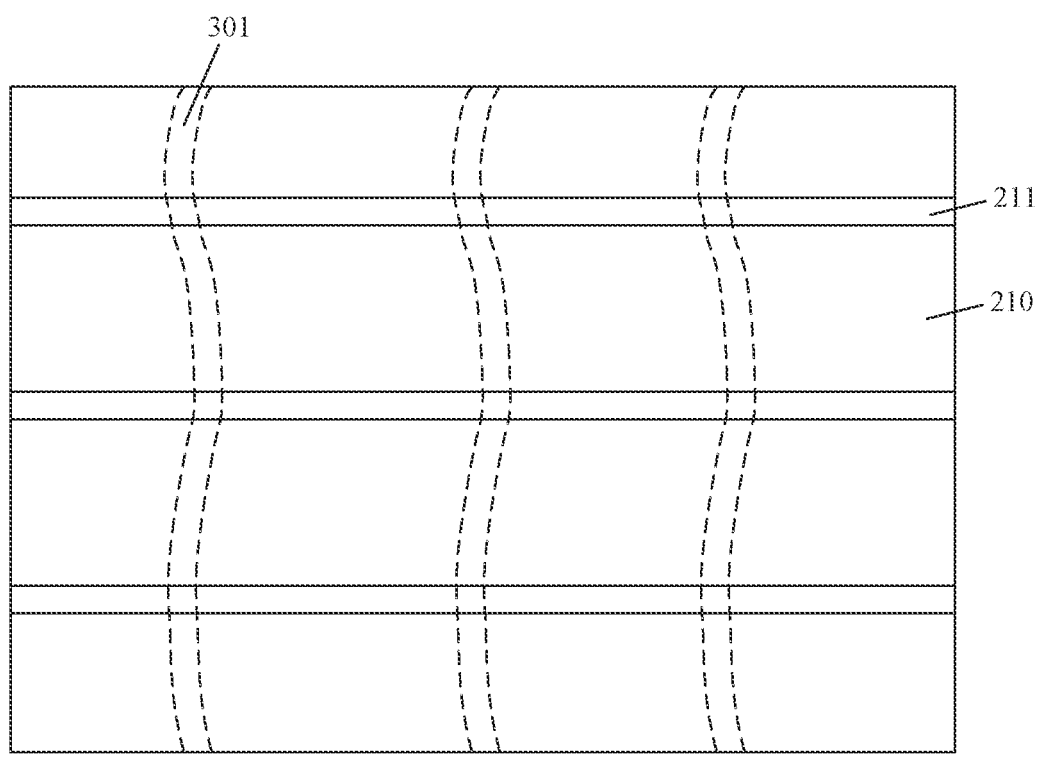
FIG. 3 is a schematic structural diagram of a base plate of an injection mould of one specific example of the disclosure.

In this specific example, the first gas duct 211 and the second gas duct 212 are both linear gas ducts. In other specific examples, the gas duct can also be curved, such as the gas duct 301 in FIG. 3. The shape and extending direction of the various gas ducts can be designed according to the arrangement of the gas hole of the substrate of the chip to be packaged. Any shape and arrangement rule shall fall within the protection scope of the disclosure, and are not listed one by one here.

Figure 4A:
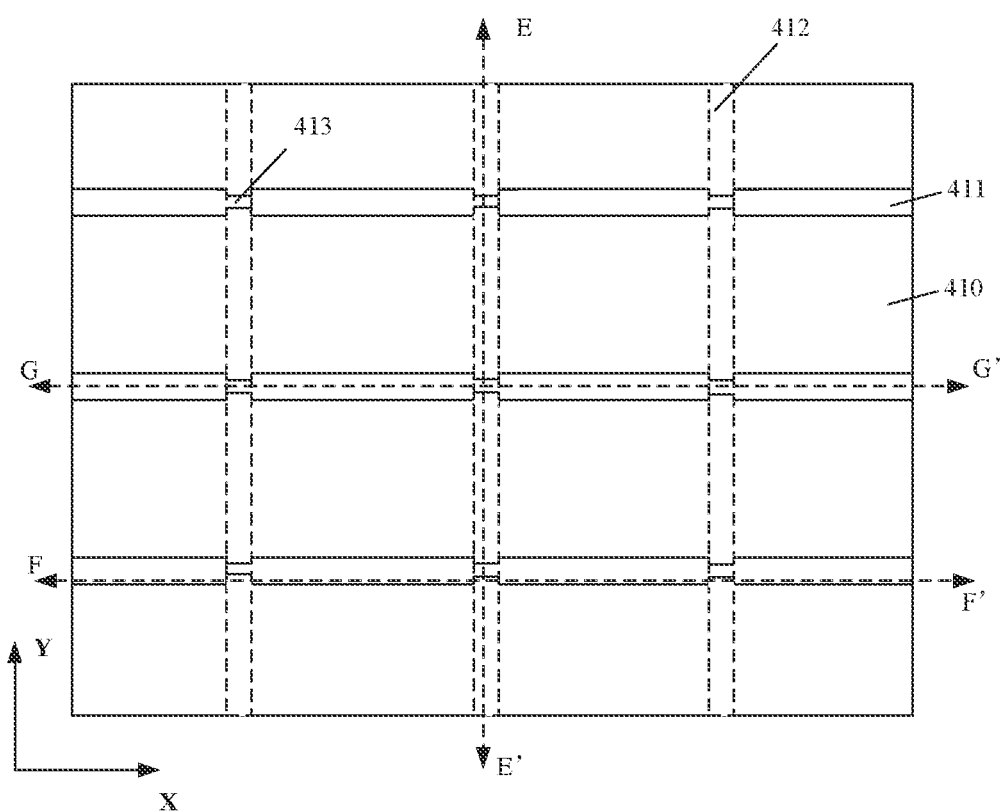
FIG. 4A to FIG. 4D are schematic structural diagrams of a base plate of an injection mould of one specific example of the disclosure.
Figure 4B:
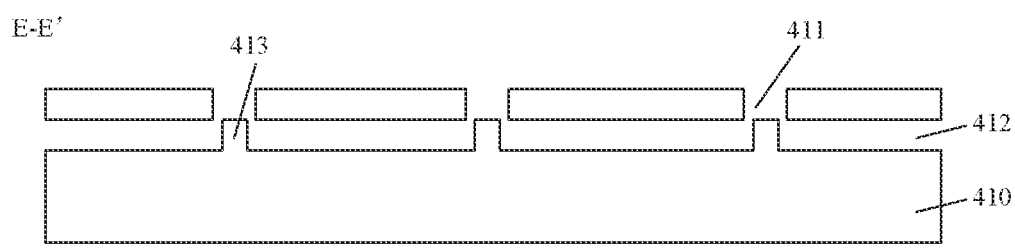
Figure 4C:
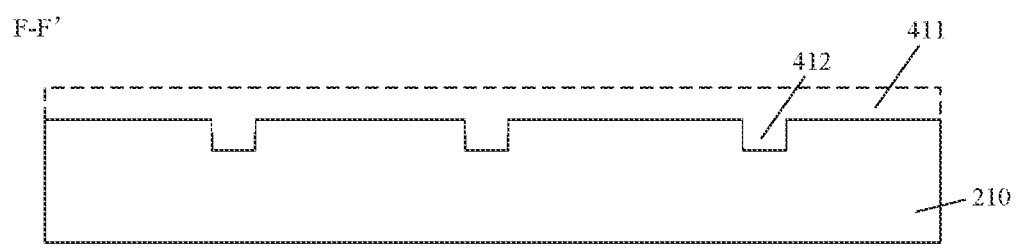
Figure 4D:
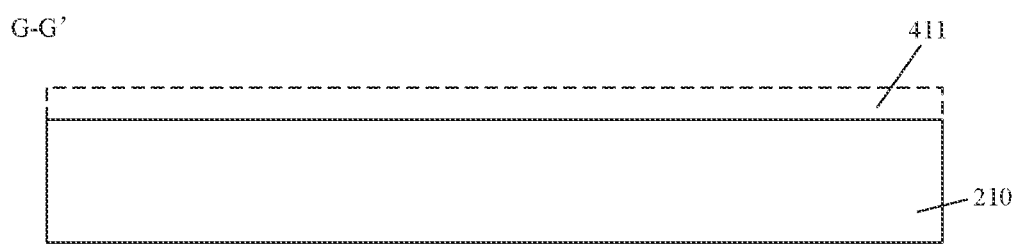

Referring to FIG. 4A to FIG. 4D, schematic structural diagrams of a base plate of another specific example of the disclosure are illustrated. FIG. 4A is a schematic top view of a surface of the base plate 410; FIG. 4B is a schematic sectional diagram along a cut line E-E' in FIG. 4A; FIG. 4C is a schematic sectional diagram along a cut line F-F' in FIG. 4A; and FIG. 4D is a schematic sectional diagram along a cut line G-G' in FIG. 4A.

In this specific example, a first gas duct 411 extending in a first direction (x-axis) is on the surface of the base plate 410, and a second gas duct 412 extending in a second direction (y-axis) is inside the base plate 410. The first gas duct 411 is a groove formed on the front surface of the base plate 410, and the second gas duct 412 is a tunnel buried in the base plate 410. The first gas duct 411 and the second gas duct 412 connect with each other at an intersection.

Particularly, in this specific example, a step 413 is provided at a position in the second gas duct 412 which connects to the first gas duct 411. The step 413 is connected to the bottom of other positions of the first gas duct 411 in an extending direction of the first gas duct 411. In this specific example, the surface of the step 413 is flush with the bottom surface of other positions of the first gas duct 411. In other specific examples, the surface of the step 413 can also be slightly higher than or lower than the bottom surface of the first gas duct 411.

Referring to FIG. 4B, due to the existence of the step 413 at the connection between the first gas duct 411 and the second gas duct 412, in an injection moulding process of a chip, when a moulding compound enters the second gas duct 412 from the first gas duct 411, the flowing path is relatively small; and the moulding compound is easy to break at this position when taking out the packaged chip after the moulding compound is solidified, which is convenient for taking out the packaged chip from the injection mould after the injection moulding.

The injection mould further includes a cover used to cover the base plate to form a cavity with the base plate. The cavity is used to accommodate the packaged chip to be injection moulded. The gas duct of the base plate connects the cavity with the outside of the injection mould. The cover is provided with at least one injection hole used to inject the moulding compound to the cavity. A gas outlet hole can also be formed in the cover and used to connect the cavity to the outside of the injection mould.

The base plate of the injection mould has the gas ducts extending in multiple directions, and the gas ducts extending in various directions connect to form a mesh-type gas duct structure. In the injection moulding process, when two ends of part of the gas ducts are blocked, gas can still be exhausted through the gas duct in other directions, thereby lowering the risk that gas in an injection moulding cavity cannot be exhausted and improving the reliability of the packaged chip after injection moulding.

The specific example of the disclosure further provides an injection moulding method. The method performs injection moulding on a packaged chip by using the injection mould provided in the above-mentioned specific example.

Referring to FIG. 5A to FIG. 6B, schematic structural diagrams of an injection moulding process for a packaged chip in one specific example of the disclosure are illustrated.

Figure 5A:
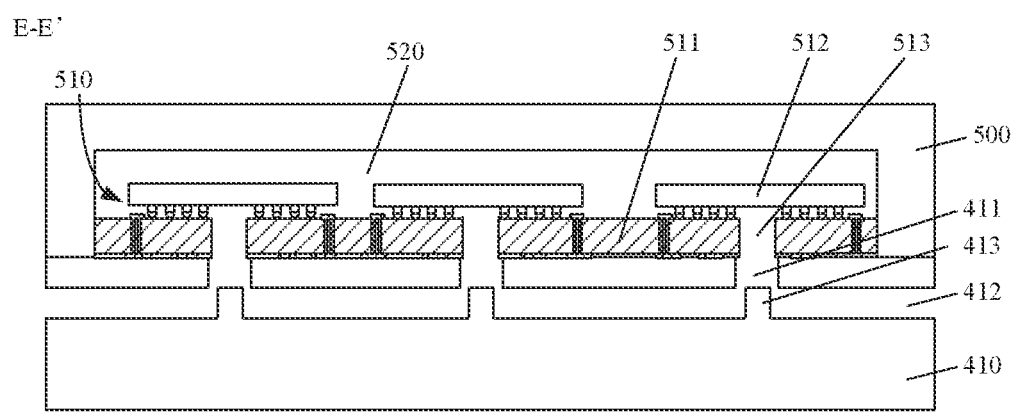
FIG. 5A to FIG. 6B are schematic structural diagrams of an injection moulding process for a packaged chip in one specific example of the disclosure.
Figure 5B:
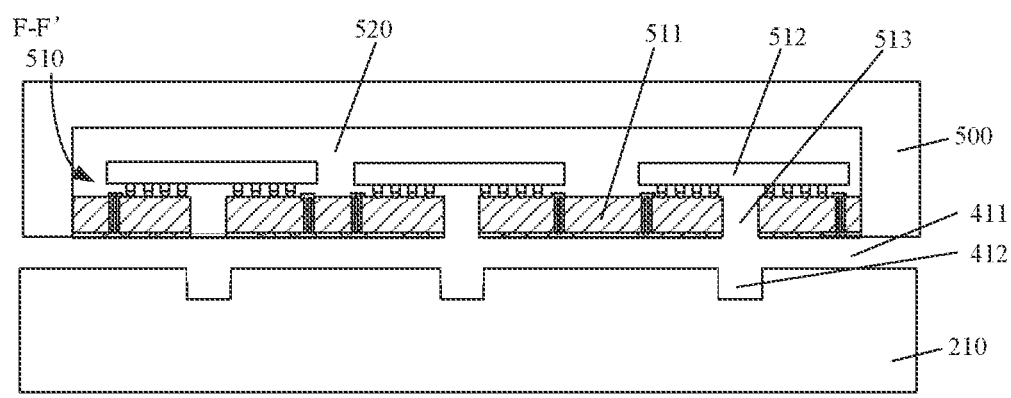

Referring to FIG. 5A to FIG. 5B, an injection mould is provided. The injection mould includes a base plate 400 and a cover 500. The specific structure of the base plate 400 refer to FIG. 4A to FIG. 4D, and details thereof are omitted here.

A packaged chip 510 to be injection moulded is placed on the front surface of the base plate 400. The packaged chip 510 includes a substrate 511 and at least one of the chips 512 fixed on the front surface of the substrate 511 by a flip chip process. The substrate is provided with a gas hole 513. The cover 500 covers the surface of the base plate 400 to form a cavity 520, and the packaged chip is located in the cavity 520. The back surface of the substrate 511 is contacted to the surface of the base plate 410, and the gas hole 513 of the substrate 511 of the packaged chip 510 connects with a gas duct of the base plate 410. The front surface and the back surface of the substrate 511 are two opposite surfaces.

The substrate 511 of the packaged chip 510 is a circuit board on which an electric connection structure such as a circuit and a solder pad is formed. Several chips 512 are packaged on the surfaces by the flip chip process. The chip 512 is flipped on the surface of the substrate 511 and is electrically connected to the electric connection structure on the surface of the substrate 511 by a solder bump. The solder bump can be a solder ball, a copper pillar, or other structures.

At least one of the gas holes 513 is formed in a substrate region that each chip 512 of the packaged chip 510 is located. At least part of the gas holes connects with the gas duct of the base plate 410 to exhaust air by the gas duct. Preferably, all the gas holes 513 of the substrate 511 connect with the gas duct of the base plate 410 to improve the exhaust efficiency. In this specific example, the gas hole 513 is a circular hole, the size of which is slightly less than or equal to the size of a gas outlet of the gas duct of the base plate 410. Specifically, the diameter of the gas hole 513 is less than the width of the first gas duct 411. In one specific example, the diameter of the gas hole 513 ranges from 800 μm to 0.8 mm, and the width of the first gas duct 411 ranges from 100 μm to 1 mm.

In this specific example, the base plate 410 includes a groove-like first gas duct 411 located on the front surface and a second gas duct 412 buried in the base plate 410. The gas holes 513 of the substrate 511 are arranged in an extending direction of the first gas duct 411. The gas holes 513 located on the same straight line connect to the same first gas duct 411.

In other specific examples, the gas ducts of the base plate can be all buried in the base plate. The gas outlet of the gas duct, which is a hole, penetrates through to the front surface of the base plate. The gas hole 513 of the substrate 511 connects with at least part of the gas outlets on the front surface of the base plate.

Figure 6A:
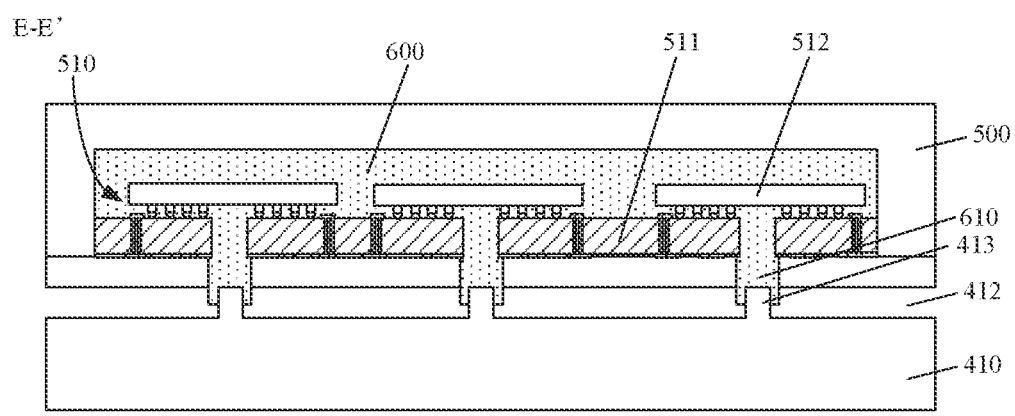
Figure 6B:
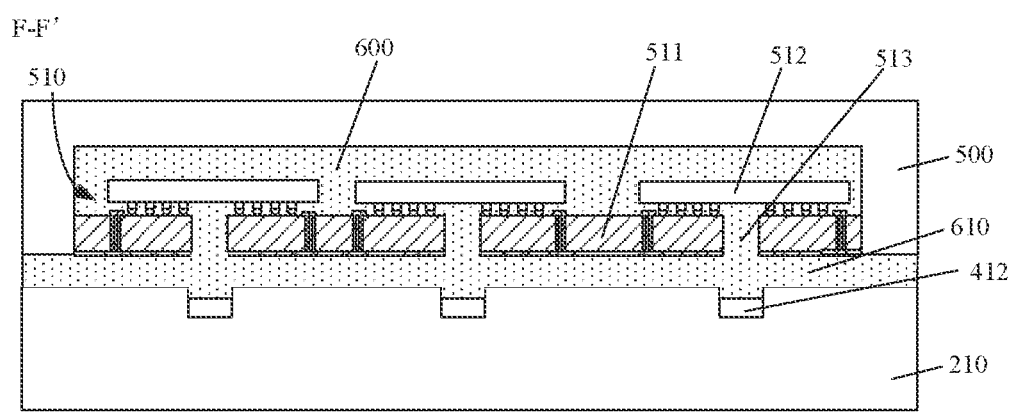

Referring to FIG. 6A to FIG. 6B, a moulding compound 600 in the state of liquid is injected to the cavity 520 through an injection hole (not shown) in the cover 500 (referring to FIG. 5A to FIG. 5B). In the injection process, at least part of air in the cavity 520 is exhausted through the gas hole 513 (referring to FIG. 5A to FIG. 5B) and the gas ducts to the outside of the injection mould.

When the moulding compound in the state of liquid is injected to the cavity 520, the flow rate is controlled so that gas in the cavity 520 has enough time to be exhausted through the gas duct. Preferably, in some specific examples, the injection moulding pressure intensity in the injection moulding process is controlled to range from 7E6 Pa to 1E7 Pa.

In some specific examples, two or more injection holes can be formed in the cover 500. The moulding compound can be injected to the cavity through the two or more injection holes to improve the injection efficiency. The cover 500 can also have a gas outlet hole (not shown). The gas at the upper part of the cavity 520 can be exhausted to the outside through the gas outlet hole in the cover 500, thereby reducing the volume of gas needing to be exhausted from the gas ducts of the base plate 410. The flow rate of the injection moulding compound can be properly increased to improve the injection moulding efficiency.

After the cavity is filled up with the moulding compound, heat treatment is performed to solidify the moulding compound 600; and the packaged chip 510 covered with the moulding compound is taken out from the cavity.

In this specific example, in the injection moulding process, the moulding compound 600 enters the first gas duct 411 from the gas hole of the substrate 511. The packaged chip 510 is taken out from the mould, carrying the moulding compound formed in the first gas duct 411, so that the back surface of the substrate 511 has a moulded strip 610. The moulded strip 610 closes the gas holes located on the same straight line to enhance the closing effect on the gas hole.

In other specific examples, groove-like gas ducts extending in multiple directions can be formed on the front surface of the base plate, so that moulded strips 610 extending in multiple directions are formed on the substrate 511 after the injection moulding is completed. The gas duct distribution positions on the surface of the base plate need to be reasonably set according to the positions of the electric connection structure such as the solder pads formed on the back surface of the substrate 511 to avoid the formed moulded strip 610 from affecting the connection structure on the back surface of the substrate 511.

Referring to FIG. 6A, one step 413 is provided at the connection between the first gas duct 411 and the second gas duct 412, a connection channel between the first gas duct 411 and the second gas duct 412 is relatively narrow, and the connection intensity of the moulding compound at the connection between the first gas duct 411 and the second gas duct 412 is relatively low. Therefore, after the injection moulding is completed, in the process of taking out the packaged chip 510, the moulding compound at the connection between the first gas duct 411 and the second gas duct 412 is easy to break so that it is easy to take out the packaged chip 510. After the packaged chip 510 is taken out, the method further includes the following acts. A solder ball is formed on the surface of the other side of the packaged chip 510, the solder ball is electrically connected to the chip 512 on the front surface of the substrate 511 by the electric connection structure at the substrate 511; then the substrate 511 is cut to form a moulded packaged chip including a single chip 512.

The above descriptions are only the preferred examples of the disclosure. It should be noted that those skilled in the art can further make several improvements and retouches without departing from the principles of the disclosure. These improvements and retouches shall all fall within the protection scope of the disclosure.

The invention claimed is:

1. An injection mould, comprising,
a base plate used to place a packaged chip to be injection moulded, wherein the packaged chip comprises a substrate and at least one chip fixed on a front surface of the substrate by a flip chip process, and the substrate has a gas hole penetrating through the substrate;
wherein two or more gas ducts that extend in at least two intersecting directions and connect with one another are formed in the base plate; two ends of each one of the two or more gas ducts are open and connect to an exterior of the injection mould, at least one of the two or more gas ducts is buried into the base plate, and in a direction perpendicular to a surface of the base plate, the two or more gas ducts that extend in at least two intersecting directions are respectively located at different depths in the base plate; and
wherein each of the two or more gas ducts is provided with a gas outlet used to connect with the gas hole penetrating through the substrate, and the gas outlet is located at an intersection of different gas ducts of the two or more gas ducts, so that the intersected gas ducts connect with one another.

2. The injection mould according to claim 1, wherein at least one of the two or more gas ducts is located on a front surface of the base plate; the at least one gas duct located on the front surface of the base plate is a groove located on the front surface of the base plate; and the at least one gas duct buried into the base plate is a tunnel located inside the base plate.

3. The injection mould according to claim 1, wherein all gas ducts that extend in at least one of the directions are buried into the base plate.

4. The injection mould according to claim 1, wherein a maximum distance between any two points on an edge of a cross section perpendicular to a length direction of each of the two or more gas ducts ranges from 500 μm to 5 mm.

5. The injection mould according to claim 1, wherein a size of the gas outlet of each of the two or more gas ducts is larger than or equal to a size of the gas hole penetrating through the substrate.

6. The injection mould according to claim 1, wherein a first gas duct of the two or more gas ducts extending in a first direction and a second gas duct of the two or more gas ducts extending in a second direction are formed in the base plate; the first gas duct is a groove formed on the surface of the base plate; the second gas duct is a tunnel buried into the base plate; and the second gas duct and the first gas duct connect with each other at the intersection.

7. The injection mould according to claim 6, wherein a step is provided in the second gas duct at a position connecting to the first gas duct; and the step is connected to a bottom of the first gas duct in an extending direction of the first gas duct.

8. The injection mould according to claim 6, wherein the substrate has a plurality of gas holes penetrating through the substrate; the two or more gas ducts comprise a plurality of first gas ducts, the plurality of gas holes of the substrate of the packaged chip to be injection moulded are arranged in a straight line; an extending direction of the first gas duct is consistent with a direction in which the plurality of gas holes are arranged; and each of the plurality of first gas ducts is used to connect to the plurality of gas holes on a same straight line.

9. The injection mould according to claim 1, further comprising a cover used to cover the base plate to form a cavity with the base plate; the cavity is used to accommodate the packaged chip to be injection moulded; each of the two or more gas ducts of the base plate connects the cavity with the exterior of the injection mould; and the cover is provided with at least one injection hole used to inject a moulding compound to the cavity.

10. An injection moulding method, comprising:
providing the injection mould according to claim 9 and the packaged chip to be injection moulded;
placing the packaged chip on the base plate of the injection mould and covering the base plate with the cover to form the cavity, the packaged chip being located in the cavity, a back surface of the substrate being contacted to the surface of the base plate, and the gas hole penetrating through the substrate of the packaged chip connecting with the two or more gas ducts of the base plate; and
injecting the moulding compound in a state of liquid to the cavity through the injection hole of the cover, at least part of gas in the cavity being exhausted out of the injection mould through the gas hole and each of the two or more gas ducts during injection of the moulding compound.

11. The injection moulding method according to claim 10, wherein the moulding compound is injected to the cavity through two or more injection holes.

12. The injection moulding method according to claim 10, wherein at least one of the gas holes is formed in a substrate region on which each one of a plurality of packaged chips is located.

13. The injection moulding method according to claim 10, further comprising: after the cavity is filled up with the moulding compound in the state of liquid, performing heat treatment to solidify the moulding compound in the state of liquid; and taking out the packaged chip wrapped by a solidified moulding compound from the cavity.

* * * * *